United States Patent … US 7,052,552 B2
Kwan et al. … Date of Patent: May 30, 2006

(54) GAS CHEMISTRY CYCLING TO ACHIEVE HIGH ASPECT RATIO GAPFILL WITH HDP-CVD

(75) Inventors: Michael Kwan, Redwood City, CA (US); Eric Liu, Menlo Park, CA (US)

(73) Assignee: Applied Materials, Santa Clara, CA (US)

(*) Notice: Subject to any disclaimer, the term of this patent is extended or adjusted under 35 U.S.C. 154(b) by 805 days.

(21) Appl. No.: 09/920,891

(22) Filed: Aug. 2, 2001

(65) Prior Publication Data

US 2002/0040764 A1    Apr. 11, 2002

Related U.S. Application Data

(62) Division of application No. 09/648,395, filed on Aug. 24, 2000, now Pat. No. 6,335,288.

(51) Int. Cl.
H01L 21/00 (2006.01)
C23C 16/00 (2006.01)

(52) U.S. Cl. .......... 118/697; 118/715; 118/695; 118/696; 118/698; 438/694; 438/695; 438/784; 438/787; 438/788; 427/585; 427/578; 427/579; 427/588; 204/192.23; 204/192.1; 204/298.01

(58) Field of Classification Search ........ 438/714, 438/694, 695, 697, 784; 118/715, 697, 695, 118/696, 698; 156/345; 427/585, 578, 579; 204/192.23, 192.01
See application file for complete search history.

(56) References Cited

U.S. PATENT DOCUMENTS

| | | | |
|---|---|---|---|
| 4,468,413 A | 8/1984 | Bachmann | 427/39 |
| 4,690,746 A | 9/1987 | McInerney et al. | |
| 4,851,370 A | 7/1989 | Doklan et al. | 437/225 |
| 4,872,947 A | 10/1989 | Wang et al. | 156/643 |
| 4,892,753 A | 1/1990 | Wang et al. | 427/38 |
| 4,894,352 A | 1/1990 | Lane et al. | 437/238 |
| 4,960,488 A | 10/1990 | Law et al. | 156/643 |
| 5,000,113 A | 3/1991 | Wang et al. | 118/723 |
| 5,013,691 A | 5/1991 | Lory et al. | 437/238 |
| 5,089,442 A | 2/1992 | Olmer | 432/235 |
| 5,156,881 A | 10/1992 | Okano et al. | 427/572 |
| 5,215,787 A | 6/1993 | Homma | 427/248.1 |
| 5,271,972 A | 12/1993 | Kwok et al. | 427/579 |
| 5,275,977 A | 1/1994 | Otsubo et al. | 437/235 |
| 5,279,865 A | 1/1994 | Chebi et al. | 427/574 |
| 5,288,518 A | 2/1994 | Homma | 427/255.1 |

(Continued)

FOREIGN PATENT DOCUMENTS

EP    0 549 994 A2    7/1993

(Continued)

OTHER PUBLICATIONS

U.S. Appl. No. 08/344,283, filed Nov. 22, 1994, Mizuno.

(Continued)

Primary Examiner—Ram N Kackar
(74) Attorney, Agent, or Firm—Townsend Townsend Crew, LLP

(57) ABSTRACT

A method and apparatus are disclosed for depositing a dielectric film in a gap having an aspect ratio at least as large as 6:1. By cycling the gas chemistry of a high-density-plasma chemical-vapor-deposition system between deposition and etching conditions, the gap may be substantially 100% filled. Such filling is achieved by adjusting the flow rates of the precursor gases such that the deposition to sputtering ratio during the deposition phases is within certain predetermined limits.

6 Claims, 6 Drawing Sheets

U.S. PATENT DOCUMENTS

| | | | |
|---|---|---|---|
| 5,302,233 A | 4/1994 | Kim et al. | 156/636 |
| 5,314,724 A | 5/1994 | Tsukune et al. | 427/489 |
| 5,316,278 A * | 5/1994 | Sherstinsky et al. | 269/254 R |
| 5,319,247 A | 6/1994 | Matsuura | 257/760 |
| 5,334,552 A | 8/1994 | Homma | 437/195 |
| 5,362,526 A | 11/1994 | Wang et al. | |
| 5,385,763 A | 1/1995 | Okano et al. | 427/572 |
| 5,399,529 A | 3/1995 | Homma | 437/195 |
| 5,413,967 A | 5/1995 | Matsuda et al. | 437/235 |
| 5,416,048 A | 5/1995 | Blalock et al. | 437/228 |
| 5,420,075 A | 5/1995 | Homma et al. | 437/195 |
| 5,429,995 A | 7/1995 | Nishiyama et al. | 437/238 |
| 5,468,342 A * | 11/1995 | Nulty et al. | 216/67 |
| 5,474,589 A | 12/1995 | Ohga et al. | 65/397 |
| 5,563,105 A | 10/1996 | Dobuzinsky et al. | 437/240 |
| 5,571,576 A | 11/1996 | Qian et al. | 427/574 |
| 5,599,740 A | 2/1997 | Jang et al. | 437/190 |
| 5,624,582 A * | 4/1997 | Cain | 216/67 |
| 5,648,175 A | 7/1997 | Russell et al. | 428/472.3 |
| 5,661,093 A | 8/1997 | Ravi et al. | 438/763 |
| 5,679,606 A | 10/1997 | Wang et al. | |
| 5,719,085 A | 2/1998 | Moon et al. | 438/424 |
| 5,776,834 A | 7/1998 | Avanzino et al. | |
| 5,850,105 A | 12/1998 | Dawson et al. | 257/758 |
| 5,858,876 A * | 1/1999 | Chew | 424/451 |
| 5,872,052 A | 2/1999 | Iyer | 438/622 |
| 5,872,058 A | 2/1999 | Van Cleemput et al. | |
| 5,908,672 A | 6/1999 | Ryu et al. | |
| 5,913,140 A | 6/1999 | Roche et al. | |
| 5,915,190 A * | 6/1999 | Pirkle | 204/192.23 |
| 5,937,323 A * | 8/1999 | Orczyk et al. | 427/573 |
| 5,939,831 A | 8/1999 | Fong et al. | 315/111.21 |
| 5,944,902 A | 8/1999 | Redeker et al. | 118/723 AN |
| 5,953,635 A | 9/1999 | Andideh | |
| 5,968,610 A * | 10/1999 | Liu et al. | 427/255.37 |
| 5,990,000 A * | 11/1999 | Hong et al. | 438/631 |
| 6,030,881 A * | 2/2000 | Papasouliotis et al. | 438/424 |
| 6,037,018 A | 3/2000 | Jang et al. | |
| 6,039,851 A | 3/2000 | Iyer | |
| 6,059,643 A | 5/2000 | Hu et al. | |
| 6,093,654 A | 7/2000 | Koyama | |
| 6,136,685 A | 10/2000 | Narwankar et al. | 438/624 |
| 6,167,834 B1 | 1/2001 | Wang et al. | |
| 6,170,428 B1 | 1/2001 | Redeker et al. | |
| 6,182,602 B1 | 2/2001 | Redeker et al. | |
| 6,189,483 B1 | 2/2001 | Ishikawa et al. | |
| 6,191,026 B1 | 2/2001 | Rana et al. | |
| 6,194,038 B1 | 2/2001 | Rossman | |
| 6,197,705 B1 | 3/2001 | Vassiliev | |
| 6,203,863 B1 | 3/2001 | Liu et al. | |
| 6,268,274 B1 * | 7/2001 | Wang et al. | 438/597 |
| 6,310,755 B1 * | 10/2001 | Kholodenko et al. | 361/234 |
| 6,335,288 B1 | 1/2002 | Kwan et al. | |
| 6,395,150 B1 | 5/2002 | Van Cleemput et al. | |
| 2001/0030351 A1 | 10/2001 | Wang et al. | |

FOREIGN PATENT DOCUMENTS

| | | |
|---|---|---|
| GB | 2 320 133 A | 6/1998 |
| JP | 6 1276-977 A | 12/1986 |
| JP | 2-58836 A | 2/1990 |
| JP | 4-239750 | 8/1992 |
| JP | 4-341568 | 11/1992 |
| JP | 7-161703 A | 6/1995 |
| JP | 10 340900 A | 3/1999 |
| WO | WO 92/20833 | 11/1992 |

OTHER PUBLICATIONS

U.S. Appl. No. 08/584,042, filed Jan. 6, 1996, Rana et al.
U.S. Appl. No. 09/400,338, filed Sep. 21, 1999, Xia et al.
Usami et al. "Low Dielectric Constant Interlayer Using Fluorine-Doped Silicon Oxide", Jpn. J. Appl. Phys. vol. 33, Jan. 1994. pp. 408-412.
Lee et al. "Dielectric Planarization Techniques For Narrow Pitch Multilevel Interconnects", VMIC Conference. Jun. 1987. pp. 85-92.
Abraham, "Reactive Facet Tapering of Plasma Oxide For Multilevel Interconnect Applications", VMIC Conference. Jun. 1987. pp. 115-121.
Shapiro et al. "Dual Frequency Plasma CVD Fluorosilicate Glass: Water Absorption And Stability", DUMIC Conference. Feb. 1995. pp. 118-123.
Matsuda et al. "Dual Frequency Plasma CVD Fluorosilicate Glass: Deposition for 0.25 um Interlevel Dielectrics", DUMIC Conference. Feb. 1995. pp. 22-28.
Qian et al. "High Density Plasma Deposition and Deep Submicron Gap Fill with Low Dielectric Constant SiOF Films", California. DUMIC Conference. Feb. 1995 pp. 50-56.
Fukada et al. "Preparation of SiOF Films with Low Dielectric Constant By ECR Plasma CVD", Japan. DUMIC Conference. Feb. 1995. pp. 43-49.
Laxman, "Low e Dielectrics: CVD Fluorinated Silicon Dioxides", Semiconductor International. May 1995. pp. 71-74.
Hayasaka et al. "High-Quality and Low Dielectric Constant SiO2 CVD Using High Density Plasma", Dry Processing Symposium. vol. 2, Nov. 1993. pp. 163-168.
Musaka, "Single Step Gap Filling Technology fo Subhalf Micron Metal Spacings on Plasma Enhanced TEOS/O2 Chemical Vapor Deposition System", International Conference on Solid State Devices and Materials. Japan. 1993. pp. 510-512.
Galiano et al. "Stress-Temperature Behavior of Oxide Films Used for Intermetal Dielectric Applications", VMIC Conference. Jun. 1992. pp. 100-106.
Yu et al. "Step Coverage Study of Peteos Deposition for Intermetal Dielectric Applications", VMIC Conference. Jun. 1990. pp. 166-172.
Chang et al. "Frequency Effects and Properties of Plasma Deposited Fluorinated Silicon Nitride", American Vacuum Society. 1988. pp. 524-532.
Robles et al. "Effects of RF Frequency and Deposition Rates on the Moisture Resistance of PECVD TEOS-Based Oxide Films", ECS Extended Abstracts. vol. 92-1. May 1992. pp. 215-216.
U.S. Appl. No. 09/854,083, filed May 11, 2001.
V.Y. Vassilieuv, et al., "Trends in void-free pre-metal CVD dielectrics," Solid State Technology, pp. 129-136. www.solid-state.com.
Musaka, "Single Step Gap Filling Technology to Subhalf Micron Metal Spacings on Plasma Enhanced TEOS/02 Chemical Vapor Deposition System," International Conference on Solid State Devices and Materials pp. 510-512, held in Japan (1993).
U.S. Appl. No. 09/400,338, filed Sep. 21, 1999, Xia et al.
Abraham, "Reactive Facet Tapering of Plasma Oxide for Multilevel Interconnect Applications," VMIC Conference, pp. 115-121 (1987).
Lee et al., "Dielectric Planarization Techniques for Narrow Pitch Multilevel Interconnects," VMIC Conference, pp. 85-92 (1987).
Qian et al., "High Density Plasma Deposition and Deep Submicron Gap Fill with Low Dielectric Constant SiOF Films," DUMIC Conference, pp. 50-56, held in California (1995).

* cited by examiner (a)

(b)

(c)

GAS CHEMISTRY CYCLING TO ACHIEVE HIGH ASPECT RATIO GAPFILL WITH HDP-CVD

CROSS REFERENCE TO RELATED APPLICATION

This application is a divisional of Ser. No. 09/648,395 now U.S. Pat. No. 6,335,288, filed Aug. 24, 2000.

BACKGROUND OF THE INVENTION

The present invention relates to the manufacture of integrated circuits on a substrate. More particularly, the invention relates to a method and apparatus for improving the gap-fill capability of high-density-plasma chemical-vapor-deposition techniques.

One of the primary steps in the fabrication of modern semiconductor devices is the formation of a thin film on a semiconductor substrate by chemical reaction of gases. Such a deposition process is referred to as chemical vapor deposition ("CVD"). Conventional thermal CVD processes supply reactive gases to the substrate surface where heat-induced chemical reactions take place to produce a desired film. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive.

Any of these CVD techniques may used to deposit conductive or insulative films during the fabrication of integrated circuits. For applications such as the deposition of insulation films as premetal or intermetal dielectric layers in an integrated circuit or for shallow trench isolation, one important physical property of the CVD film is its ability to completely fill gaps between adjacent structures without leaving voids within the gap. This property is referred to as the film's gapfill capability. Gaps that may require filling include spaces between adjacent raised structures such as transistor gates or lines and etched trenches or the like.

As semiconductor device geometries have decreased in size over the years, the ratio of the height of such gaps to their width, the so-called "aspect ratio," has dramatically increased. Gaps having a combination of a high aspect ratio and a small width present a challenge for semiconductor manufacturers to fill completely. In short, the challenge usually is to prevent the deposited film from growing in a manner that closes off the gap before it is filled. Failure to fill the gap completely results in the formation of voids in the deposited layer, which may adversely affect device operation, for example by trapping undesirable impurities.

The semiconductor industry is thus continuously striving to develop new technologies and new film deposition chemistries to address challenges such as the gapfill issue. For example, several years ago some manufacturers switched from a silane-based chemistry for the deposition of intermetal dielectric silicon oxide layers to a TEOS-based (tetraethoxysilane) chemistry. This switch was at least in part due to the improved gapfill capability of the TEOS-based oxide layers. While a TEOS-based chemistry does indeed have improved gapfill capabilities, it too runs up against limitations when required to completely fill sufficiently high-aspect-ratio small-width gaps.

One process that the semiconductor industry has developed to improve the gapfill capability of a variety of different deposition processes, including TEOS-based silicon oxide deposition chemistries, is the use of a multistep deposition and etching process. Such a process is often referred to as a deposition/etch/deposition process or "dep/etch/dep" for short. Such dep/etch/dep processes divide the deposition of the gapfill layer into two or more steps separated by a plasma etch step. The plasma etch step etches the upper corners of the first deposited film more than the film portion deposited on the sidewall and lower portion of the gap, thereby enabling the subsequent deposition step to fill the gap without prematurely closing it off. Typically, dep/etch/dep processes use a "sputter-etch" process in which physical sputter is combined with chemical etch. Such dep/etch/dep processes can be performed using either multiple chambers (separate chambers dedicated solely to either the deposition or etch steps) or with a single chamber in an in situ process. Generally, for any given deposition chemistry, dep/etch/dep processes can be used to fill higher-aspect-ratio small-width gaps than a standard deposition step for the particular chemistry would allow.

HDP-CVD processes were not expected to share the same gapfill problems as other CVD processes. This is because argon or another sputtering agent is commonly introduced into the gaseous mixture during an HDP-CVD deposition process, and also because the application of an RF bias provides a potential that drives directional ions. The combination of deposition gases and sputtering agent result in a process that simultaneously deposits a film over the substrate and sputters the growing film. For this reason, HDP-CVD techniques are sometimes referred to as simultaneous dep/etch processes. It has been found in practice, however, that while HDP-CVD processes generally have better gapfill capabilities than similar non-HDP-CVD processes, for certain gap widths there remains a limit to the aspect ratio of gaps that can be filled. For example, dielectric gapfill with HDP-CVD has not been achieved for straight-walled gaps having a width of 0.15 µm and with an aspect ratio that exceeds 4.5; for some gaps that have tapered walls, the gapfill limit may be at a higher aspect ratio, but an upper limit nonetheless always exists. This is due in part to the fact that the sputtering component of the HDP-CVD process acts isotropically; because of the characteristic breadloafing shape of the growing film produced during deposition, anisotropic etching removal of excess material would be more advantageous.

In view of the above problems that persist with prior-art HDP-CVD gapfill deposition techniques, new and improved methods of filling gaps with a HDP-CVD process are desirable.

SUMMARY OF THE INVENTION

The disadvantages of the prior art are overcome with a method of gapfilling that implements gas-chemistry cycling within an HDP-CVD environment. The gas-chemistry cycling can be understood by considering one particular embodiment of the invention in which a series of gaps formed between a number of stepped surfaces on the substrate are filled. In this embodiment, a dielectric film is deposited on the substrate in a process chamber through a series of gas-cycling steps. First, a gaseous mixture containing a deposition gas and an inert gas source is provided to the process chamber. A high-density plasma is generated from this gaseous mixture to deposit some material on the substrate, partially filling the gaps before a void is formed. Then, the gas chemistry is cycled so that after cooling the substrate an etchant gas is flowed into the process chamber and selectively removes material at the top of the gaps without affecting the material already in the bottom of the gap. This reopens the gap so that more material can be deposited, so the gas chemistry is cycled again, providing a gaseous mixture that contains a deposition gas and an inert gas. A high-density plasma is generated from this gaseous mixture to deposit additional material in the gaps. Depending on the characteristics of the gaps, this may be sufficient to fill them; for some gaps, continued cycling of the gas chemistry with additional etch and deposition cycles may be used to fill them completely.

The mixed deposition and sputtering characters of the HDP cycles may be characterized by the ratio of deposition to sputtering, a useful parameter being the ratio of the sum of the net deposition rate and blanket sputtering rate to the blanket sputtering rate. In one embodiment of the invention, the first HDP cycle is performed with a deposition/sputter ratio between 5 and 20; preferably, this ratio is in the range of 9–15. The deposition/sputter ratio for each subsequent HDP deposition cycle is also preferably within the range of 5–20. In one embodiment, the second deposition/sputter ratio is less than the ratio for the first deposition step. The etchant gas may be provided as remotely dissociated etchant atoms in some embodiments, while in other embodiments, the etchant gas is provided in situ, thereby permitting a continuous process with a single chamber. The dissociated etchant atoms are preferably fluorine atoms, which are provided by $NF_3$ in one embodiment.

The methods of the present invention may be embodied in a computer-readable storage medium having a computer-readable program embodied therein for directing operation of a substrate processing system. Such a system may include a process chamber, a plasma generation system, a substrate holder, a gas delivery system, and a system controller. The computer-readable program includes instructions for operating the substrate processing system to form a thin film on a substrate disposed in the processing chamber in accordance with the embodiments described above.

A further understanding of the nature and advantages of the present invention may be realized by reference to the remaining portions of the specification and the drawings.

DESCRIPTION OF THE SPECIFIC EMBODIMENTS

I. Introduction

Embodiments of the present invention are directed to a method and apparatus for depositing a dielectric film on a substrate. For gaps with a given width, these embodiments using gas chemistry cycling within an HDP-CVD environment permit the dielectric film to be deposited with substantially 100% gapfill at increased aspect ratios. For example, for 0.15-μm gaps, substantially 100% gapfill is achieved for aspect ratios as large as 6:1. The etching phase of the gas chemistry cycling can readily be performed with an in situ process, thereby permitting the total deposition to proceed with a continuous process.

II. Exemplary Substrate Processing System

Figure 1A:
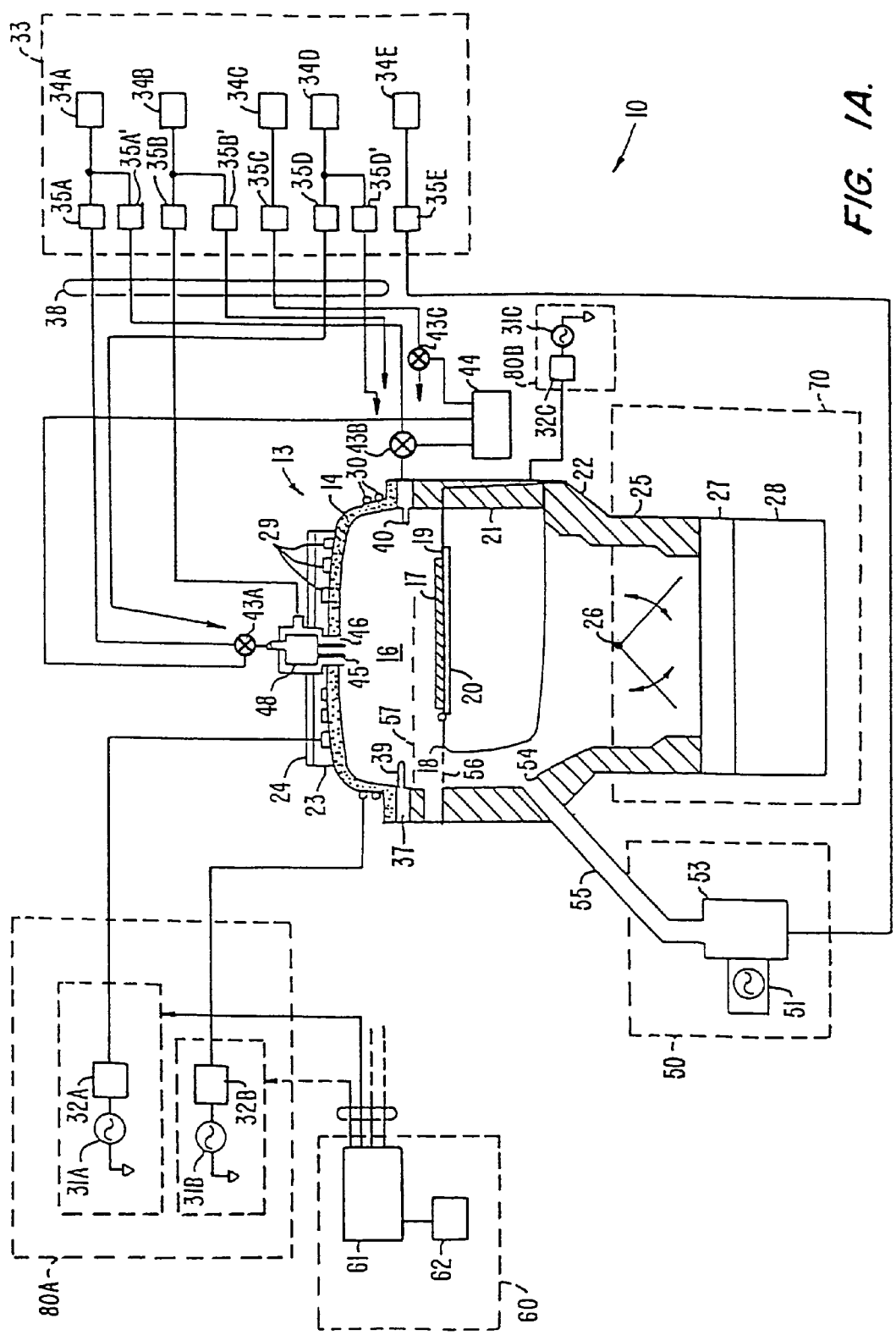
FIG. 1A is a simplified diagram of one embodiment of a high-density plasma chemical vapor deposition system according to the present invention.

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF ("BRF") generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
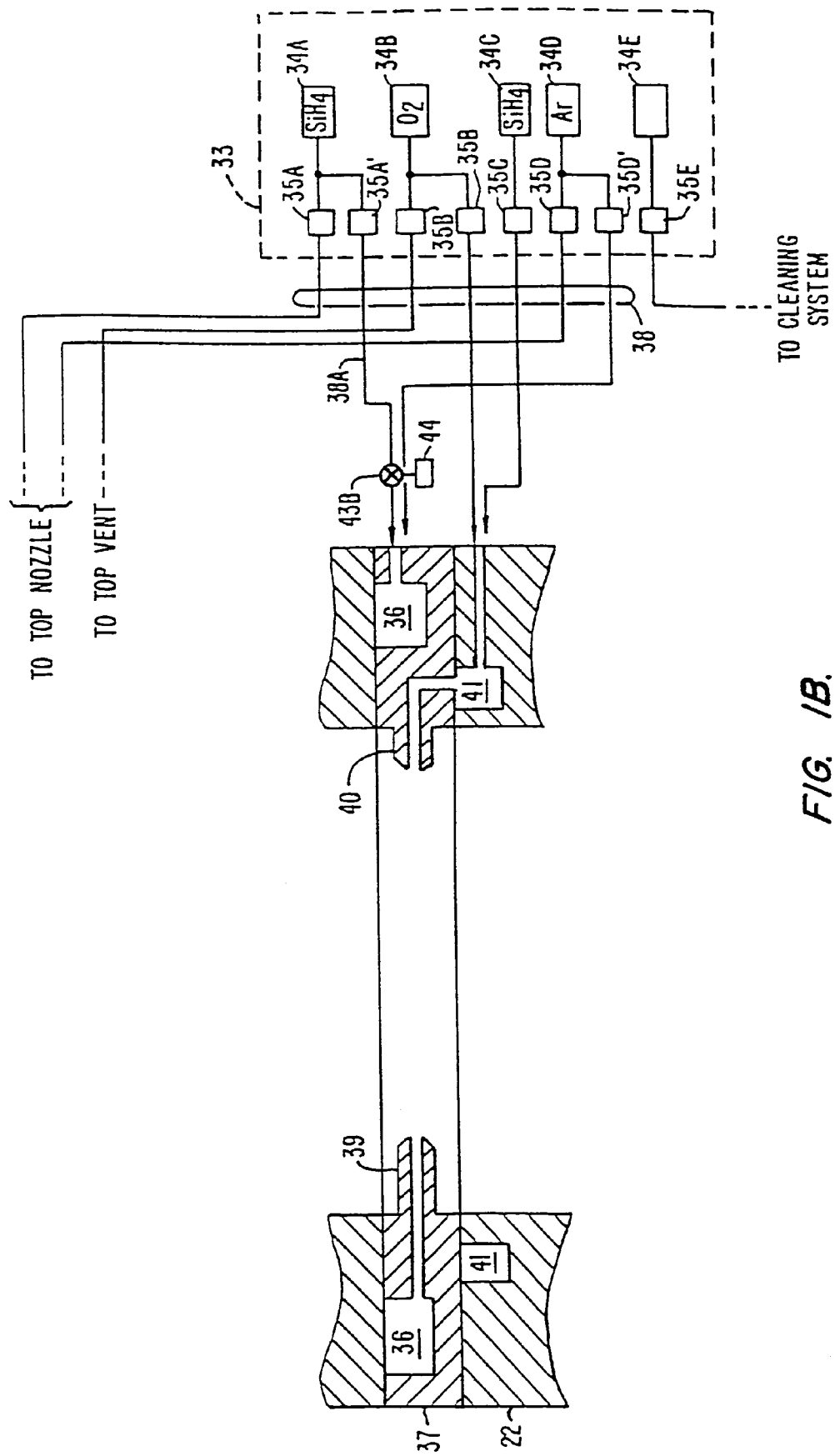
FIG. 1B is a simplified cross section of a gas ring that may be used in conjunction with the exemplary CVD processing chamber of FIG. 1A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process. In one embodiment, this cleaning system is used to dissociate atoms of the etchant gas remotely, which are then supplied to the process chamber 13. In another embodiment, the etchant gas is provided directly to the process chamber 13. In still a further embodiment, multiple process chambers are used, with deposition and etching steps being performed in separate chambers.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 65, and a light pen 66, as depicted in FIG. 1C.

Figure 1C:
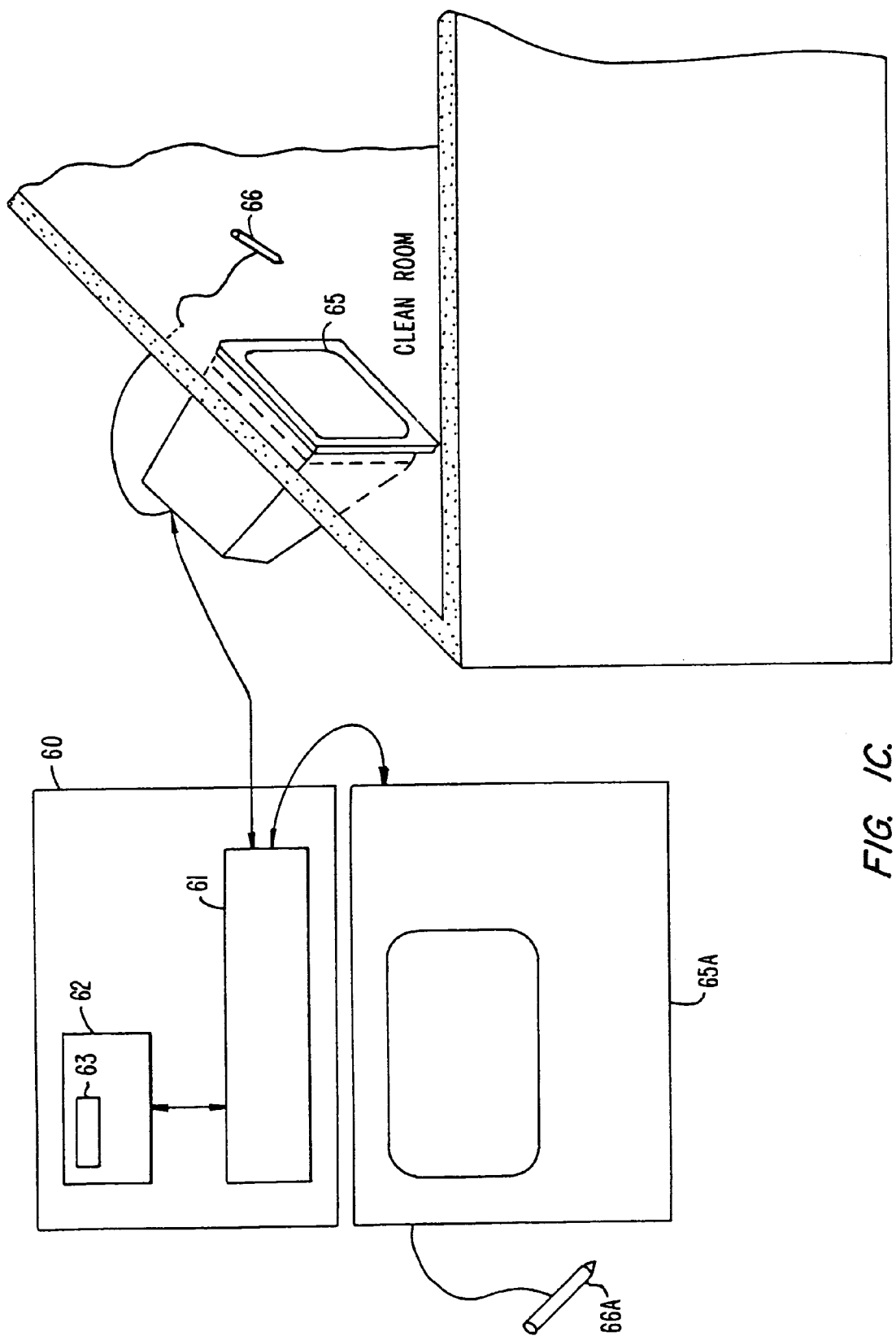
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
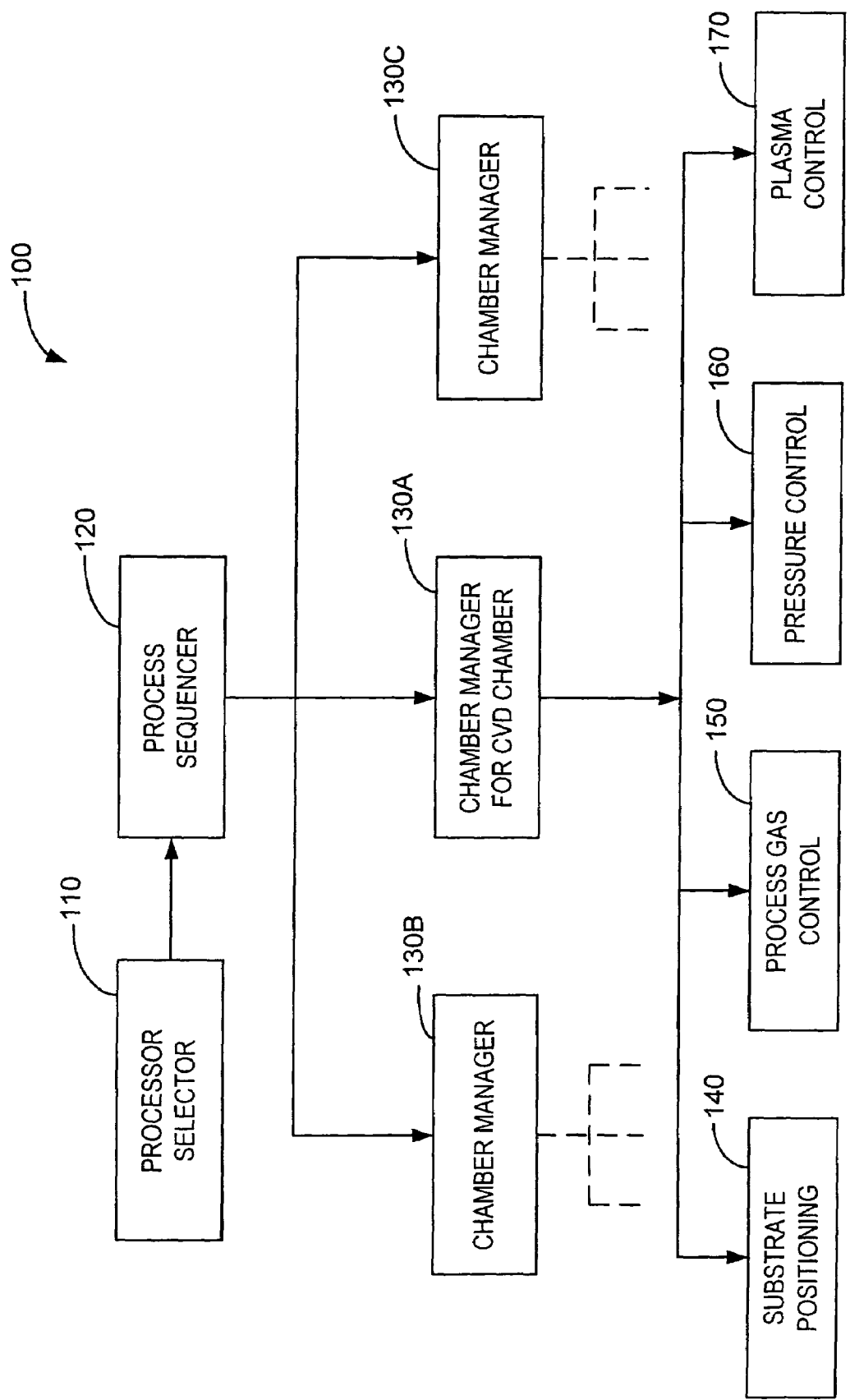
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A-C, which controls multiple processing tasks in chamber 13 and possibly other chambers (not shown) according to the process set sent by sequencer subroutine 120.

Examples of chamber component subroutines are substrate positioning subroutine 140, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 130A schedules process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a plasma-enhanced CVD ("PECVD") reactor or other reactor in the multichamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996, entitled "Symmetric Tunable Inductively-coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

III. Gas-Chemistry Cycling According to the Present Invention

The present invention incorporates a gas-chemistry cycling procedure into an HDP-CVD process. Without such gas-chemistry cycling, the gapfill capability of an HDP-CVD process depends on an intimate balance between the simultaneous deposition and sputtering characteristics of the process: if the process is dominated by deposition, the deposited material will tend to cusp, resulting in poor gapfilling and the formation of voids. Conversely, if the process is dominated by sputtering, corners of the underlying structures may be cut, leading to the formation of leakage currents and device failure.

It is accordingly useful to characterize HDP-CVD processes in terms of a ratio such as the "dep/sputter" ratio, $$\frac{D}{S} \equiv \frac{\text{(net deposition rate)} + \text{(blanket sputtering rate)}}{\text{(blanket sputtering rate)}},$$

which increases with increased deposition and decreases with increased sputtering. As used in the definition of D/S, the "net deposition rate" refers to the deposition rate that is measured when deposition and sputtering are occurring simultaneously. The "blanket sputter rate," however, refers to the sputter rate measured when the process recipe is run without deposition gases; the servo pressure is adjusted to the deposition pressure and the sputter rate is measured on a blanket thermal oxide.

Alternative ratios may also be used to characterize the deposition and sputtering contributions of the HDP process, although the embodiments described here make that characterization with the D/S ratio. A common alternative ratio is the "etch/dep" ratio, $$\frac{E}{D} \equiv \frac{\text{(source only deposition rate)} - \text{(net deposition rate)}}{\text{(source only deposition rate)}},$$

which increases with increased sputtering and decreases with increased deposition. As used in the definition of E/D, the "net deposition rate" again refers to the deposition rate that is measured when deposition and sputtering are occurring simultaneously. The "source only deposition rate," however, refers to the deposition rate that is measured when the process recipe is run with no RF bias (i.e. with no sputtering). It is evident that while D/S and E/D are not precise reciprocals, they are inversely related. Conversion between such characteristic ratios will thus be understood by those of skill in the art.

Figure 2:
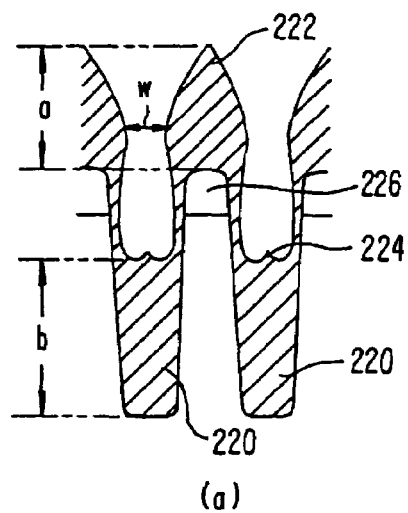
FIG. 2(a) illustrates the characteristic deposition profile for an HDP-CVD gapfill process with high deposition/sputter ratio and optimized RF power.
FIG. 2(b) illustrates the characteristic deposition profile for an HDP-CVD gapfill process with low deposition/sputter ratio.
FIG. 2(c) illustrates the characteristic deposition profile for an HDP-CVD gapfill process with high deposition/sputter ratio and nonoptimized RF power.
Figure 2:
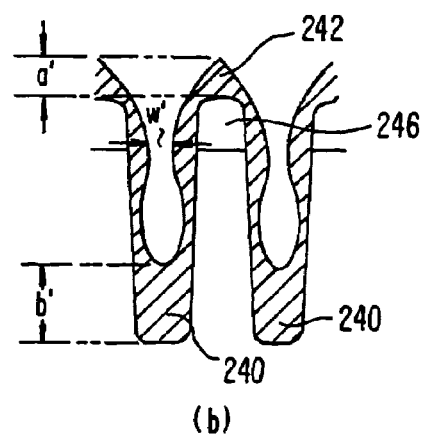
Figure 2:
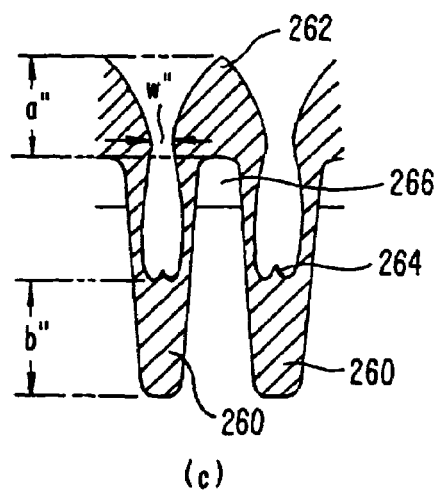

Notwithstanding the fact that HDP-CVD processes involve simultaneous deposition and sputtering, there has been found to be a limit to the aspect ratios of gaps that can be filled, regardless of the value of D/S achieved by the process recipe. It has been discovered by the inventors that this aspect-ratio limit may be increased by incorporating gas-chemistry cycling when certain unpredicted constraints are imposed on the value of D/S. The relevance of the D/S value can be more fully understood with reference to FIGS. 2(a)–2(c). Use of a specific value of D/S in performing HDP-CVD results in a characteristic deposition profile, three of which are illustrated in FIGS. 2(a)–(c) for certain parameters. In FIG. 2(a), the characteristic deposition profile is shown for a high D/S ratio (‰9) with optimized RF power; FIG. 2(b) similarly shows the characteristic deposition profile for a low D/S ratio (~4); and FIG. 2(c) shows the characteristic deposition profile for a high D/S ratio (‰9) with nonoptimized RF power.

There are several features worthy of note in distinguishing these deposition profiles, and which are helpful in understanding how the present invention achieves substantially 100% gapfill for gaps with aspect ratios at least as large as 6:1. For example, in FIG. 2(a), in using HDP-CVD to deposit material in gaps 220 and over line 226 with a D/S value ‰9, a tall hat 222 is formed over the line 226 and small peaks 224 are formed in the material deposited in the gaps 220. This qualitative shape is a result of the D/S value and is thus also seen in FIG. 2(c), where HDP-CVD with a similar D/S ratio is also used to deposit material in gaps 260 and over line 266. A similarly tall hat 262 is formed over the line 266 and small peaks 264 are similarly formed in the material deposited in the gaps 260. A different characteristic profile is seen in FIG. 2(b), which results when HDP-CVD is used with a relatively lower D/S ratio to deposit material in gaps 240 and over line 246. Although a hat 242 is formed over the line, the enhanced sputtering does not permit the formation of a peak in the material deposited in the gaps 240.

Of particular note in each instance is the relative height of the peak formed over the line to the depth of material deposited within the gaps. This is defined by the ratios a/b, a'/b', and a"/b" for FIGS. 2(a), 2(b), and 2(c) respectively. The relative peak height is significantly greater for high D/S ratios: a/b≈a"/b" >>a'/b'. A second notable feature is the minimum width separating the periodic structures. When high-aspect-ratio structures are filled with a relatively low D/S ratio (~5), as in FIG. 2(b), the minimum width w' occurs below the top of the line, at least during the initial deposition. When the D/S ratio is sufficiently high (‰9), however, as in FIG. 2(a), the minimum width w occurs above the top of the line. Similar behavior is seen for the minimum width w" in FIG. 2(c). It will also be appreciated that improved gap filling results when the minimum width is as large as possible. As shown in FIGS. 2(a)–(c), the minimum width is greatest where the D/S ratio is large and the RF power (source and bias) is optimized: w'≈w"<<w.

In one embodiment of the invention, the D/S ratio for the first phase of the gas-chemistry cycling is within the range of 5–20, preferably near the middle of this range, i.e. 9–15. If the D/S ratio is less than 5, there is a danger that excessive sputtering will erode the underlying structure. If the D/S ratio is larger than 20, excess deposition material will cause the tall hat 222 or 262 to bulge unduly and close off a void. The deposition profile characteristics of a large hat over the line coupled with a large minimum width separating the sides of the deposition material are thus both useful when the gas chemistry is cycled to an etching phase. At the conclusion of the first phase, in the embodiment where a large D/S ratio is used with optimized RF power, the gap is partially filled with deposited material having a profile such as that shown in FIG. 2(a). If the aspect ratio were sufficiently high and the process were to continue, the gap would be pinched off, leaving a void in the deposited material. This is avoided by stopping the deposition and flowing an etchant gas into the chamber. In one embodiment, the atoms of the etchant gas are dissociated remotely in a manner known to those of skill in the art (e.g. by microwave energy) while in another embodiment they are provided in situ. Further, in one embodiment, the dissociated etchant atoms comprise fluorine atoms, which are preferably provided by $NF_3$.

During the subsequent etching phase, the dissociated etchant atoms act to remove more material anisotropically from the top of the gap than at the bottom of the gap. The relatively large width between the deposition material, and its position above the surface of the line, permit the etching phase to proceed for a shorter period of time while restoring the approximate original shape of the gap. Additionally, the height of the hat provides ample protective material above the line so that the etchant is prevented from damaging the line. Thus, the deposition profile produced during the first phase acts to neutralize the danger that there will be inadvertent and undesirable etching of the lines of the structure.

After these two phases, the gap has a reduced aspect ratio, and therefore fewer constraints need be imposed on the third phase, in which additional material is deposited in the gap. In some embodiments where the original aspect ratio is not too large, any prior-art method for completing the filling of the partially filled gap may be used. In other embodiments where the original aspect ratio is larger, it is advantageous also to use a high D/S ratio in the third phase, again preferably within the range of 5–20. For the same reasons discussed for the first phase, a D/S ratio within this range forces as much of the dielectric material as possible into the gap without eroding the underlying structure before there is a danger of a void being pinched off.

Figure 3:
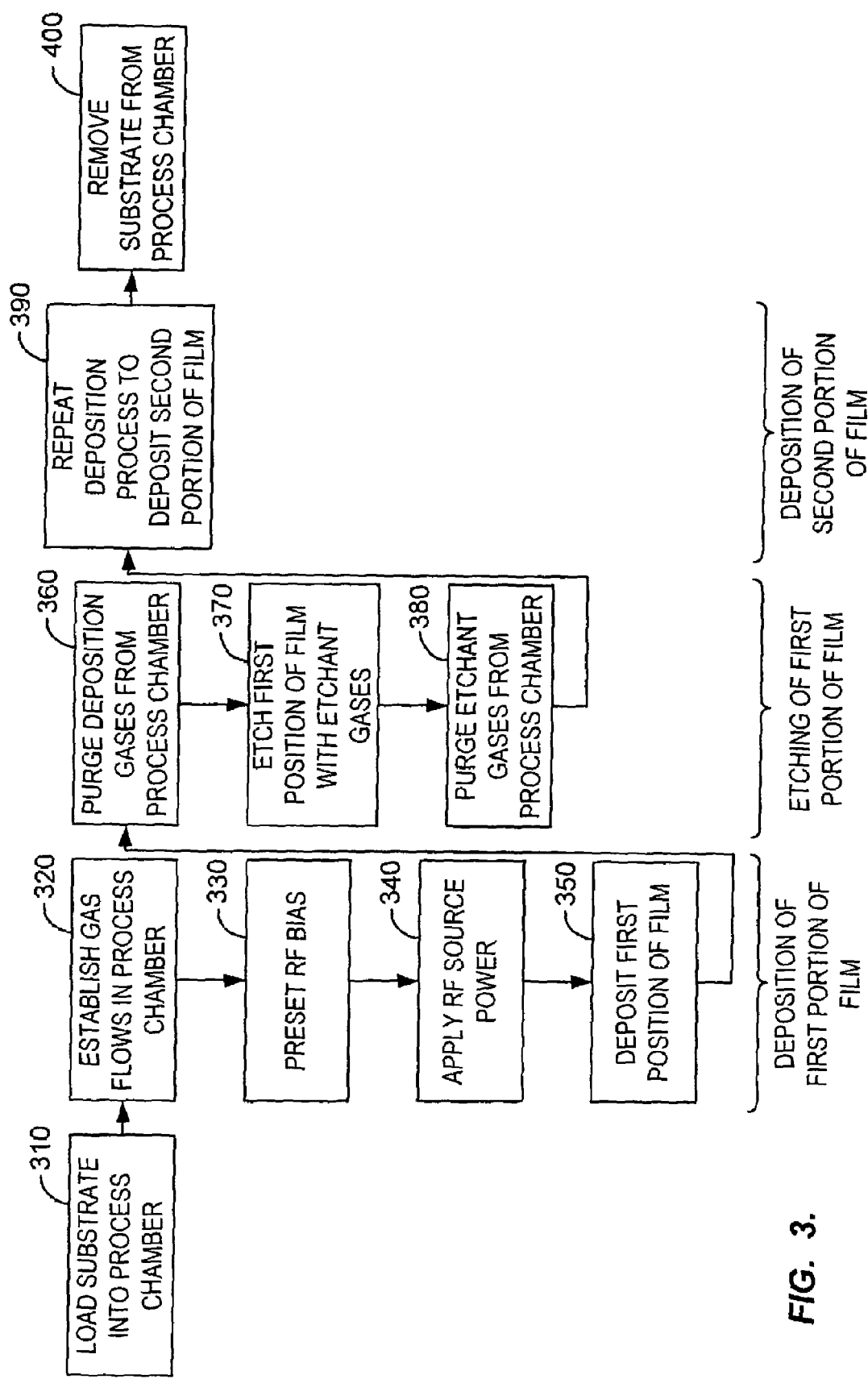
FIG. 3 is a flowchart showing the steps of one embodiment of the invention.

FIG. 3 shows a flow chart of a specific exemplary plasma process used in one embodiment to deposit a film on a substrate with stepped surfaces forming gaps with an aspect ratio as great as 6:1. The substrate is loaded into the process chamber 13 through a vacuum-lock door onto the substrate support member 18 at step 310. Once the substrate is properly positioned, gas flows are established at step 320 to stabilize the pressure, which is maintained throughout the first deposition of the film by manipulating the throttle valve 26 with a stepper motor while the vacuum pump 28 pumps at a constant capacity. The pressure is preferably maintained at a value less than 50 mtorr. When establishing gas flows at step 320, a nominal source bias (e.g., 10 W) may be applied.

Once gas flows and pressure are established, the bias RF is preset at step 330, a relatively low power (e.g., 300 W) being used to establish proper operating conditions. An RF source power (e.g., 1400 W at both top and side coils) within the chamber is then applied at step 340. With a relatively low bias RF power, the plasma may be struck using a low-pressure strike technique such as described in the copending commonly assigned application entitled "LOW PRESSURE STRIKE IN HDP CVD CHAMBER," by Kasra Khazeni et al., filed on Dec. 23, 1999 and assigned Application Ser. No. 09/470,819, herein incorporated by reference for all purposes. After the plasma has been struck, the source bias, RF bias, and gas flows are adjusted to the desired deposition conditions with appropriate D/S values at step 350. During the deposition, RF energy is applied to the top coil 29 and the side coil 30 by SRF generators 31A and 31B to form an inductive plasma. SRF generators 31A and 31B continue to apply RF energy to the top and side coils throughout the process. SRF generators 31A and 31B are driven at a nominal frequency of about 2 MHz at about 0–7000 W, but preferably at about 6600 W. This power is split between the top coil 29, which may be driven at about 1.8 MHz, for example, and the side coil 30, which may be driven at about 2.1 MHz, for example. The top coil 29 may receive about 4800 W and the side coil 30 about 1800 W. Additionally, BRF generator 31C is driven at a frequency of about 13.6 MHz and a power of about 2000 W during step 350. The power from BRF generator 31C is delivered to the substrate-receiving portion 19, with the chamber body member 22 supplying the complementary electrode for capacitive coupling. The temperature during the deposition step is generally greater than 400° C.

After the first deposition is completed, the gas chemistry is cycled to etch the deposited layer. At step 360, the deposition gases are purged from the process chamber 13 (e.g., by flowing an inert gas into the chamber) and at step 370, a remotely dissociated etchant gas is provided to the process chamber from the cleaning system 50. The microwave power used to dissociate the etchant gas is approximately 3000 W. In another embodiment, the etchant gas is provided in situ by supplying the etchant gas directly to the process chamber 13. In one embodiment, the wafer is cooled for the etching step to a temperature substantially less than the temperature during the deposition step. The etch rate is approximately exponentially dependent on temperature, so a lower temperature generally permits a more controlled etch. The etching temperature is preferably less than 250° C., more preferably less than 150° C. In one embodiment the wafer is cooled externally such as with a cooling station and in another embodiment the wafer is cooled in situ, for example by flowing backside helium to the wafer.

After the film has been etched, the gas chemistry is cycled back to the deposition phase. At step 380, the etchant gases are purged from the process chamber 13 and at step 390, the deposition process is repeated. This step includes the individual steps described above to generate the appropriate deposition conditions. Such deposition conditions may be approximately the same, although the gas flow rates may alternatively be adjusted to provide a lower D/S ratio. After the second deposition is completed, the process chamber 13 is again purged and the deposited substrate is removed.

Table I shows one recipe for depositing a USG film according to the present invention, showing the parameters used for the principal steps of the process. In the table, two numbers are provided for the argon and silane flows, the first denoting the side flow rate and the second denoting the top flow rate.

TABLE I

| Parameter | First Deposition (Step 350) | Etching (Step 370) | Second Deposition (Step 390) |
|---|---|---|---|
| Top RF power | 4800 W | | 4800 W |
| Side RF power | 1800 W | | 1800 W |
| Bias RF power | 2000 W | | 2000 W |
| Microwave power | | 3000 W | |
| Ar flow rate | 110 + 16 sccm | | 110 + 16 sccm |
| $O_2$ flow rate | 140 sccm | | 140 sccm |
| $SiH_4$ flow rate | 62 + 11 sccm | | 62 + 11 sccm |
| D/S ratio | 9 | | 9 |
| $NF_3$ flow rate | | 750 sccm | |

While both the parameters shown in the table and recited in the above description are appropriate for a 200 mm wafer in a nominally 5 L chamber, the methods of the present invention are not intended to be limited by the specific parameters set forth. Those of ordinary skill in the art will realize that processing parameters, such as gas flow rates, can vary for different processing chambers and different processing conditions, and that different precursors can be used (in some cases to form films of different composition, such as FSG) without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A computer-readable storage medium having a computer-readable program embodied therein for directing operation of a substrate processing system including a process chamber; a plasma generation system; a substrate holder; and a gas delivery system configured to introduce gases into the process chamber, the computer-readable program including instructions for operating the substrate processing system to deposit a dielectric film on a substrate disposed in the process chamber in accordance with the following:
    (a) providing a first gaseous mixture to the process chamber, the first gaseous mixture comprising a first deposition gas and a first inert gas source;
    (b) generating a first high-density plasma from the first gaseous mixture to deposit a first portion of the film on the substrate with a first deposition/sputter ratio within the range of 5–12, wherein the first deposition/sputter ratio is defined as a ratio of a sum of a first net deposition rate and a first blanket sputtering rate to the first blanket sputtering rate;
    (c) thereafter, cooling the substrate;
    (d) thereafter, flowing an etchant gas into the process chamber;
    (e) thereafter, providing a second gaseous mixture to the process chamber, the second gaseous mixture comprising a second deposition gas and a second inert gas source; and
    (f) generating a second high-density plasma from the second gaseous mixture to deposit a second portion of the film on the substrate.

2. The computer readable storage medium according to claim 1 wherein the second high-density plasma is generated to deposit the second portion of the film with a second deposition/sputter ratio within the range of 5–20, wherein the second deposition/sputter ratio is defined as a ratio of a sum of a second net deposition rate and a second blanket sputtering rate to the second blanket sputtering rate.

3. The computer-readable storage medium according to claim 1 wherein the dielectric film is to be deposited over a plurality of stepped surfaces formed on the substrate having gaps formed between adjacent ones of the stepped surfaces and wherein the first portion of the film partially fills the gaps.

4. A substrate processing system comprising:
    (a) a housing defining a process chamber;
    (b) a high-density plasma generating system operatively coupled to the process chamber;
    (c) a substrate holder configured to hold a substrate during substrate processing;
    (d) a gas-delivery system configured to introduce gases into the process chamber;
    (e) a pressure-control system for maintaining a selected pressure within the process chamber;
    (f) a controller for controlling the high-density plasma generating system, the gas-delivery system, and the pressure-control system; and
    (g) a memory coupled to the controller, the memory comprising a computer-readable medium having a computer-readable program embodied therein for directing operation of the substrate processing system, the computer-readable program including
        (i) instructions to control the gas-delivery system to provide a first gaseous mixture to the process chamber, the first gaseous mixture comprising a first deposition gas and a first inert gas source;
        (ii) instructions to control the high-density plasma generating system to generate a first high-density plasma from the first gaseous mixture to deposit a first portion of the film on the substrate with a first deposition/sputter ratio within the range of 5–20, wherein the first deposition/sputter ratio is defined as a ratio of a sum of a first net deposition rate and a first blanket sputtering rate to the first blanket sputtering rate;
        (iii) instructions to control the gas-delivery system thereafter to flow a heat-transfer gas to cool the substrate;
        (iv) instructions to control the gas-delivery system thereafter to flow an etchant gas into the process chamber;
        (v) instructions to control the gas-delivery system thereafter to provide a second gaseous mixture to the process chamber, the second gaseous mixture comprising a second deposition gas and a second inert gas source; and
        (vi) instructions to control the high-density plasma generating system to generate a second high-density plasma from the second gaseous mixture to deposit a second portion of the film on the substrate.

5. The substrate processing system according to claim 4 wherein the instruction to generate a second high-density plasma comprise instructions to deposit the second portion of the film with a second deposition/sputter ratio within the range of 5–20, wherein the second deposition/sputter ratio is defined as a ratio of a sum of a second net deposition rate and a second blanket sputtering rate to the second blanket sputtering rate.

6. The substrate processing system according to claim 4 wherein the dielectric film is to be deposited over a plurality of stepped surfaces formed on the substrate having gaps formed between adjacent ones of the stepped surfaces and wherein the first portion of the film partially fills the gaps.

* * * * *